United States Patent [19]
Wall

[11] Patent Number: 4,791,286
[45] Date of Patent: Dec. 13, 1988

[54] PRE-AMPLIFIER IN FOCAL PLANE DETECTOR ARRAY

[75] Inventor: Llewellyn E. Wall, Concord, Mass.

[73] Assignee: Irvine Sensors Corporation, Costa Mesa, Calif.

[21] Appl. No.: 42,686

[22] Filed: Apr. 27, 1987

[51] Int. Cl.$^4$ .............................................. H01J 40/14
[52] U.S. Cl. ................................ 250/214 A; 307/491
[58] Field of Search ....... 250/214 A, 214 C, 214 SW, 250/214 R, 578; 307/311, 355, 491

[56] References Cited

U.S. PATENT DOCUMENTS

| | | | |
|---|---|---|---|
| 4,092,611 | 5/1978 | Frederiksen et al. | 250/214 A |
| 4,300,062 | 11/1981 | Marshall, Jr. | 307/311 |
| 4,382,187 | 5/1983 | Fraleux et al. | 250/578 |
| 4,393,351 | 7/1983 | Gregorian et al. | 307/491 |
| 4,430,622 | 2/1984 | Simoes | 307/491 |
| 4,473,745 | 9/1984 | Chown | 250/214 R |
| 4,567,446 | 1/1986 | Konishi | 250/214 A |
| 4,675,532 | 6/1987 | Carson | 250/578 |
| 4,691,125 | 9/1987 | Rybicki | 307/491 |

OTHER PUBLICATIONS

Hsieh et al., "A Low-Noise Chopper-Stabilized Differential Switched-Capacitor Filtering Technique", IEEE, 1981, pp. 708–715.

*Primary Examiner*—David C. Nelms
*Assistant Examiner*—Michael Messinger
*Attorney, Agent, or Firm*—Thomas J. Plante

[57] ABSTRACT

Circuitry for a focal plane pre-amplifier is disclosed in which the input of the pre-amplifier is switched between the signal from its photo-detector and a connection to ground. During the ground-connected interval, the pre-amplifier transistor is temporarily diode-connected in such a way that the transistor's voltage is stored on a capacitor, which is connected between the incoming photo-detector signal and the input of the pre-amplifier transistor. During the photo-detector connected interval, the voltage stored on the capacitor is subtracted from the voltage signal supplied by the photo-detector.

8 Claims, 2 Drawing Sheets

PRE-AMPLIFIER IN FOCAL PLANE DETECTOR ARRAY

BACKGROUND OF THE INVENTION

This invention relates to pre-amplifiers which are located at the focal plane of a photo-detector array. Each such pre-amplifier receives its input signal from a specific detector (or detectors) in the array, and transmits its output signal to the next electronic component, e.g., a bandpass filter.

In U.S. Pat. No. 4,555,623, assigned to the assignee of this application, the requirements of focal plane pre-amplifiers are discussed at length. Among the limiting factors identified in that patent are: (1) space limitations; (2) low power limitations; (3) high gain requirements; (4) DC bias requirements; (5) low noise requirements; and (6) variable gain adjustability.

The present focal plane pre-amplifier is intended to improve on that disclosed in U.S. Pat. No. 4,555,623 in at least three respects. (1) It reduces the space, or "real estate" required for each pre-amplifier. (2) It substantially eliminates the DC bias, or offset, of the pre-amplifier. (3) It substantially eliminates the 1/f, or flicker, noise in the pre-amplifier output.

One of the proposed techniques for substantially eliminating both the DC noise component due to offset, and the AC noise component due to temporal variations, is referred to as chopper stabilization. This technique reduces low frequency noise by shifting the frequency of the noise to a higher frequency outside the passband.

The present invention provides a simpler approach to the problem, which is particularly appropriate for incorporation in focal plane electronics.

The concept of chopper stabilization is discussed in an article titled "A Low-Noise Chopper-Stabilized Differential Switched-Capacitor Filtering Technique" (by Hsieh, Gray, Senderowicz and Messerschmitt) in the 1981 IEEE Journal of Solid State Circuit, Vol. SC-16, Number 6, December 1981, at pages 708–715. That article discusses various means of noise reduction, including these three: (1) large input geometries; (2) buried channel devices; and (3) chopper-stabilized frequency translation. It recommends the chopper stabilization technique for the particular usage of concern to the authors. The article also mentions a technique which it calls "correlated double sampling". However, it rejects that approach to the problem because it "requires that the output mode of the amplifier slew back and forth between the signal level and the initialized level each clock period. This puts a severe requirement on the operational amplifier settling time."

SUMMARY OF THE PRESENT INVENTION

The present invention provides an auto-zeroing amplifier which automatically subtracts both the DC and AC noise components discussed above, using circuitry which is very simple and space-saving. In other words, it provides low offset, low 1/f noise, and very small area.

This invention uses a capacitor to store the offset voltage and the noise voltage between incoming detector signals, and then subtracts the capacitor-stored noise signals from the incoming detector signals. While this technique corresponds in general to the correlated data sampling technique discussed above, its incorporation into pre-amplifiers which receive input from focal plane photodetectors has proved to be both problem-free and advantageous.

DETAILED DESCRIPTION OF A SPECIFIC EMBODIMENT

Reference is made to U.S. Pat. No. 4,551,629, issued Nov. 5, 1985, and assigned to the assignee of this application, for a full description (which is incorporated herein by reference) of a focal plane modular array of the type in which the present invention can be incorporated with particularly useful results. That application discloses a stack of silicon chips secured together to form a module, which is used to provide an extremely dense detector array at the focal plane. The stacked chips, each of which may have an area as small as, or even smaller than, 500 mils by 500 mils, extend in planes perpendicular to the focal plane; and the detectors are supported on the focal plane, each in electrical contact with a lead on the edge of one of the chips, whose surface carries substantial electronic processing circuitry located at the focal plane.

Figure 1:
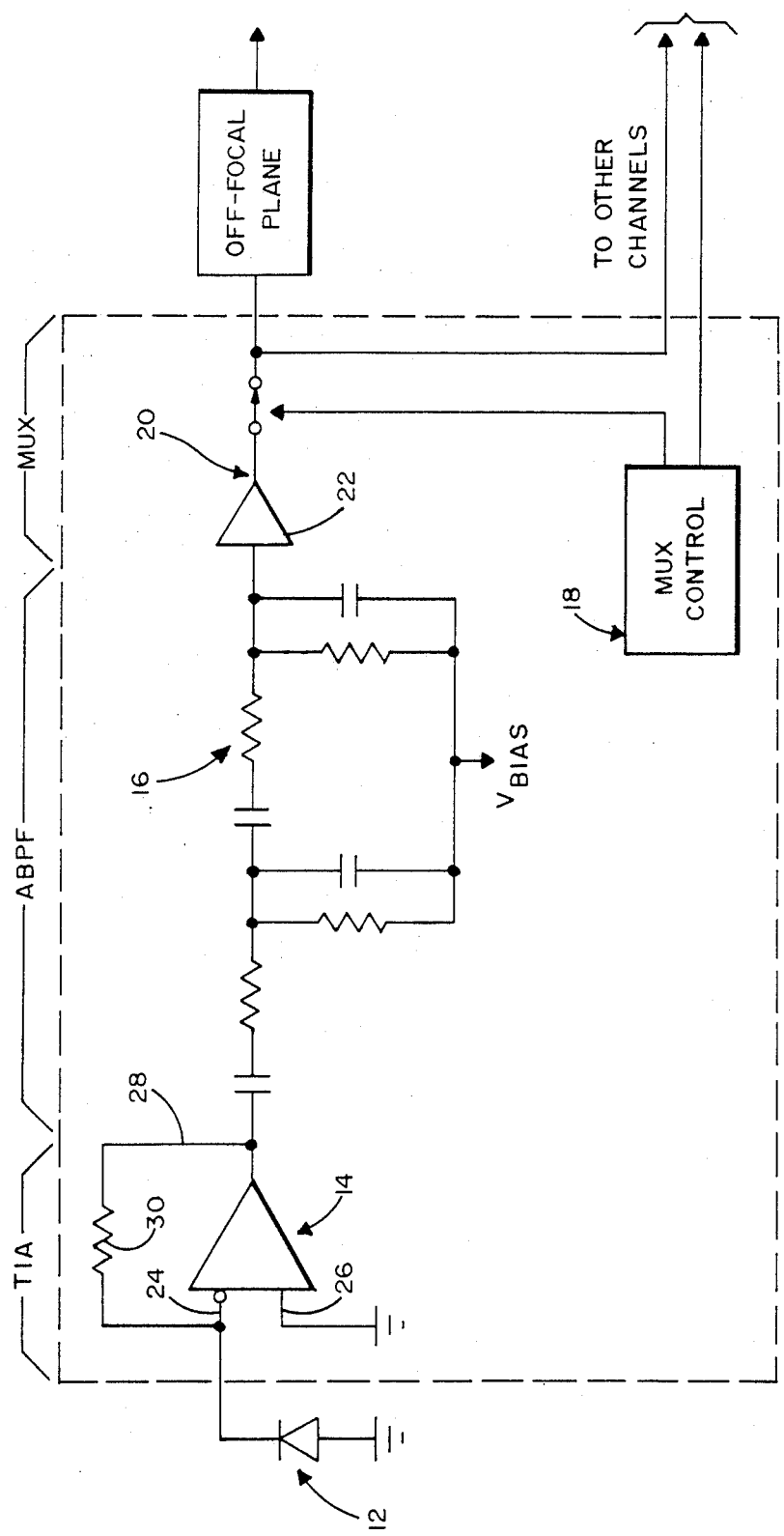
FIG. 1 is identical with FIG. 1 of U.S. Pat. No. 4,555,623 showing focal plane electronics on an IC chip, in which each detector feeds into a pre-amplifier and a bandpass filter, after which the signals of a plurality of detectors are multiplexed.

The circuitry of FIG. 1 is designed to be formed as integrated circuitry on one of the stacked silicon chips of U.S. Pat. No. 4,551,629. Each chip will have a large number of individual photo-detector circuits (e.g., 128) feeding into signal processing circuits, which are also on the chip. As shown in FIG. 1, an individual photo-detector 12 provides an input signal to a preamplifier 14, which is the focus of the present application. The output of amplifier 14, which directly receives the photo-detector signal, may be passed through an adaptive bandpass filter 16, and then fed into a multiplexer, which may, for example, be similar to that disclosed in U.S. Pat. No. 4,490,626, issued Dec. 25, 1984. In the circuitry of that application, the multiplexer comprises branches 20 and their control circuitry 18. Each branch 20 provides further amplification of each detector signal, as indicated diagrammatically at 22.

Figure 2:
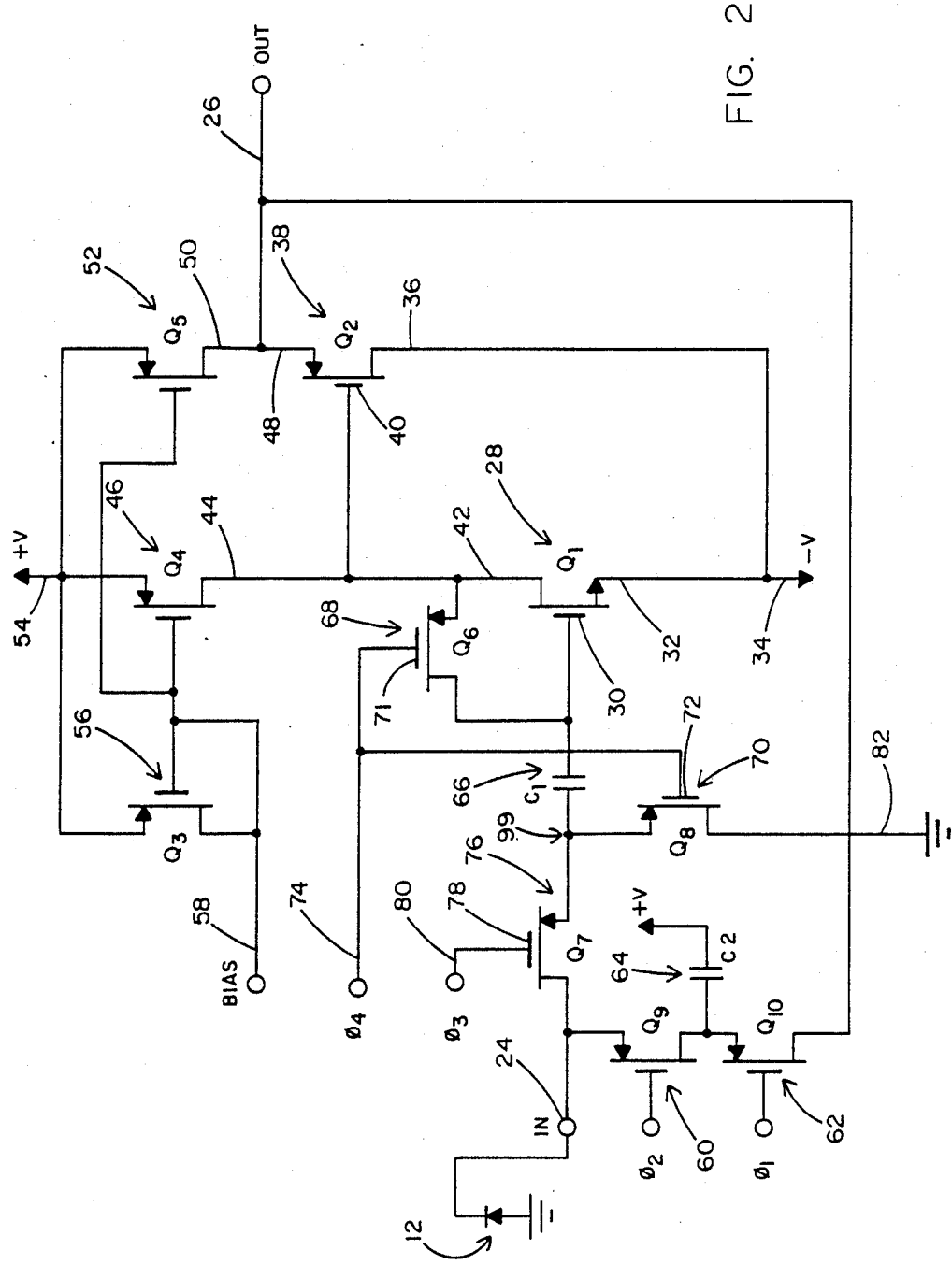
FIG. 2 is a schematic of the pre-amplifier of the present invention, which would replace the "TIA" (trans impedance amplifier) shown in FIG. 1.

The preamplifier of the present invention is shown in FIG. 2. It receives its input at 24 from an individual photodetector 12. It provides an output signal at 26 which is an input to an adaptive bankpass filter 16. The transistors in FIG. 2, for reasons discussed in U.S. Pat. Nos. 4,555,623 and 4,490,626, are preferably field effect transistors, specifically MOSFETs.

The primary amplifying tansistor is indicated at 28. Its gate 30 receives the detector voltage signals from input 24. Its source 32 is connected to a negative reference voltage 34 and to the drain 36 of a source follower transistor 38. Transistor 28, which buffers the output of transistor 22, provides a low impedance output signal at 26. Its gate 40 is actuated when current flows in transistor 28.

The drain 42 of transistor 28 is connected to the drain 44 of its current source transistor 46; and the source 48 of transistor 38 is connected to the drain 50 of its current source transistor 52. The sources of current bias transistors 46 and 52 are both connected to a positive reference voltage 54. Their gates are both connected to a diode-connected transistor 56, which is maintained at a substantially constant differential between positive voltage reference 54 and a bias voltage reference 58.

A resistance feedback network between output 26 and input 24 may conveniently be provided by a switched capacitance resistance-equivalent comprising first and second clock controlled transistor switches 60 and 62, and a capacitor 64.

The means for reducing noise at amplifier transistor 28 comprises a capacitor 66, and switching transistors which alternately (a) store across capacitor 66 a voltage representing the low frequency noise (AC plus DC), and (b) input the detector signal across capacitor 66 in such a way that the noise voltage is subtracted from the detector input voltage.

Switching transistors 68 and 70 have their respective gates 71 and 72 connected to a clock signal 74. Another switching transistor 76 has its gate 78 connected to a clock signal 80. When signal 74 is turned on, signal 80 is turned off, and vice versa.

When signal 74 is on and signal 80 is off, the signals on gates 71 and 72 actuate transistors 68 and 70 to cause current flow in those transistors. When signal 80 is on and signal 74 is off, the signal on gate 78 actuates transistor 76 to cause current flow in that transistor.

The switching transistors 76 and 70 alternately connect the intermediate circuit node 99 either to the input 24 from the detector or to ground (common) at 82. The ground connection provide a low-noise reference voltage.

Since transistor 68 is turned on (and off) simultaneously with transistor 70, the error voltage across amplifier transistor 28 is impressed across capacitor 66. This occurs because turning on transistor 68 connects the drain 42 to the gate 30 of transistor 28. This creates a current path which permits voltage to be built up on capacitor 66 equal to the desired, or gate, voltage of transistor 28 which puts it in its normal operating range. Because transistor 28 is temporarily connected as a diode, its gate voltage is determined by the amount of current flowing between the source and drain of transistor 28. This gate voltage of transistor 28 is made up of its normal operating voltage, plus any offset voltage, plus any transient noise. This total voltage is impressed across capacitor 66 during the on period of transistors 68 and 70.

When transistors 68 and 70 are turned off, this error voltage remains stored on capacitor 66, because there is no current path to permit its discharge. When transistor 76 is turned on, the incoming signal 24 from the detector arrives at gate 30 of amplifier transistor 28 after having subtracted from it the error voltage previously stored on capacitor 66.

The result is that the error (noise) due to the amplifier transistor 28 has been eliminated. This error includes both the offset, or steady state, error voltage, and the transient, or 1/f, error voltage.

As previously stated, the pre-amplifier circuit of FIG. 2, when used in the focal plane context, has at least three major advantages: (1) it reduces the required area of the pre-amplifier; (2) it reduces the low frequency 1/f noise; and (3) it reduces the voltage bias on the detector.

The increased output voltage swing, which was considered a disadvantage in the filter context of the article discussed above, is, in fact, an advantage in the present situation. This is true because it allows more gain in the pre-amplifier. With a larger amplifier output signal, subsequent noise is less significant.

In transient noise reduction, the expectation is to provide an improvement factor of from 10 to 100. In the offset aspect, the expectation is to provide an improvement factor of from 20 to 40. In space reduction, the expectation is to reduce the required real estate by about two-thirds.

From the foregoing description, it will be apparent that the apparatus disclosed in this application will provide the significant functional benefits summarized in the introductory portion of the specification.

The following claims are intented not only to cover the specific embodiments disclosed, but also to cover the inventive concepts explained herein with the maximum breadth and comprehensiveness permitted by the prior art.

What is claimed is:

1. For use in a focal plane optical-electronics system having densely-packed photo-detectors, each electronically connected to a separate amplifier, first stage amplifier circuitry comprising:

an amplifying transistor whose input receives the signal of a given photo-detector, and whose output amplifies that signal;

a capacitor connected between the input of the amplifying transistor and the photo-detector output, the output side of the capacitor being connected to the input of the amplifying transistor, and the input side of the capacitor being connected to the photo-detector output;

first switching means for causing the input side of the capacitor to receive or not receive the signal output of the photo-detector;

second switching means for causing the input and output of the amplifying transistor to be interconnected or disconnected, in order to provide a diode-connected transistor mode when they are interconnected or an amplifying transistor mode when they are disconnected; and means for synchronously operating the first and second switching means in order to alternate between (a) storing on the capacitor the voltage across the diode-connected transistor, and (b) subtracting the stored capacitor voltage from the photo-detector signal output when the transistor is in its amplifying mode.

2. The amplifier circuitry of claim 1 in which:

the first switching means is a transistor switch connected between the input side of the capacitor and ground, so that when the switch is on, the capacitor is grounded, and when the switch is off, the capacitor input receives the photo-detector output signal and transmits to the input of the amplifying transistor a signal which is altered by the voltage stored on the capacitor.

3. The amplifier circuitry of claim 2 in which:

the second switching means is a transistor switch connected between a first node at the output of the amplifying transistor and a second node common to the input of the amplifying transistor and the output side of the capacitor, so that when the switch is on, the amplifying transistor is in its diode-connected mode and the voltage across the amplifying transistor is stored on the capacitor, and when the switch is off, the signal passing through the capacitor is received at the input of, and amplified by, the amplifying transistor.

4. The amplifier circuitry of claim 3 in which:
the means for synchronously operating the first and second switching means is a clocking system whose signals cause the transistor switches in the first and second switching means to be on at the same time and off at the same time.

5. The amplifier circuitry of claim 4 in which:
each transistor switch is an insulated field effect transistor whose gate receives the alternating clocking system signals, and whose source to drain current is caused to turn on and off by the alternating signals at the gate.

6. The amplifier circuitry of claim 1 in which:
the second switching means is a transistor switch connected between a first node at the output of the amplifying transistor and a second node common to the input of the amplifying transistor and the output side of the capacitor, so that when the switch is on, the amplifying transistor is in its diode-connected mode and the voltage across the amplifying transistor is stored on the capacitor, and when the switch is off, the signal passing through the capacitor is received at the input of, and amplified by, the amplifying transistor.

7. The amplifier circuitry of claim 1 in which the capacitor and the first and second switching means constitute a compensating circuit which substantially removes error voltage from the input of the amplifying transistor.

8. The amplifier circuitry of claim 1 in which the first stage of amplification of the photo-detector signals consists of the recited electronic components.

* * * * *